United States Patent
Kuo et al.

(10) Patent No.: US 10,148,378 B2
(45) Date of Patent: Dec. 4, 2018

(54) PLL FOR CARRIER GENERATOR AND METHOD OF GENERATING CARRIER SIGNALS

(71) Applicant: TAIWAN SEMICONDUCTOR MANUFACTURING COMPANY, LTD., Hsinchu (TW)

(72) Inventors: Feng Wei Kuo, Zhudong Township (TW); Chewn-Pu Jou, Hsinchu (TW); Huan-Neng Chen, Taichung (TW); Lan-Chou Cho, Hsinchu (TW); William Wu Shen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/655,497

(22) Filed: Jul. 20, 2017

(65) Prior Publication Data

US 2017/0317774 A1 Nov. 2, 2017

Related U.S. Application Data

(63) Continuation of application No. 14/969,295, filed on Dec. 15, 2015, now Pat. No. 9,735,904.

(51) Int. Cl.
| | |
|---|---|
| *H04J 3/06* | (2006.01) |
| *H03L 7/099* | (2006.01) |
| *H04L 7/00* | (2006.01) |
| *H04L 7/033* | (2006.01) |
| *H04L 7/04* | (2006.01) |
| *H03L 7/18* | (2006.01) |
| *H04L 27/00* | (2006.01) |
| *H04L 27/26* | (2006.01) |

(52) U.S. Cl.
CPC ............ *H04J 3/0658* (2013.01); *H03L 7/099* (2013.01); *H03L 7/0991* (2013.01); *H03L 7/18* (2013.01); *H04L 7/0087* (2013.01); *H04L 7/0331* (2013.01); *H04L 7/04* (2013.01); *H04L 27/0014* (2013.01); *H04L 27/2637* (2013.01); *H04L 27/2657* (2013.01); *H03L 2207/50* (2013.01)

(58) Field of Classification Search
CPC ........... H04L 7/0331; H04L 2027/0067; H04L 27/0014; H03L 7/23; H03L 7/185
USPC ....................................................... 375/376
See application file for complete search history.

(56) References Cited

U.S. PATENT DOCUMENTS

| | | |
|---|---|---|
| 6,775,424 B2 | 8/2004 | Choudhary et al. |
| 8,279,008 B2 | 10/2012 | Hsieh et al. |
| 8,368,437 B2 | 2/2013 | Huang et al. |
| 8,427,240 B2 | 4/2013 | Hsieh et al. |
| 8,456,207 B1 | 6/2013 | Kuo et al. |

(Continued)

*Primary Examiner* — Leila Malek
(74) *Attorney, Agent, or Firm* — Hauptman Ham, LLP

(57) ABSTRACT

A phase locked loop (PLL) for a carrier generator includes a front-end circuit that receives a frequency reference signal and generates a control signal based on the frequency reference signal and a feedback signal. A demultiplexer selectively outputs the control signal to a plurality of tuning arrangements. The plurality of tuning arrangements includes a first tuning arrangement that generates a first carrier signal based on the control signal and a second tuning arrangement that generates a second carrier signal based on the control signal. A multiplexer outputs the feedback signal based on the first carrier signal and the second carrier signal.

20 Claims, 6 Drawing Sheets

(56) References Cited

U.S. PATENT DOCUMENTS

| | | |
|---|---|---|
| 8,547,151 B2 | 10/2013 | Kuo et al. |
| 8,570,082 B1 * | 10/2013 | Kuo .................... H03L 1/00 |
| | | 327/158 |
| 8,593,189 B1 | 11/2013 | Yen et al. |
| 8,593,206 B2 | 11/2013 | Chen et al. |
| 8,610,494 B1 | 12/2013 | Jin et al. |
| 8,618,631 B2 | 12/2013 | Jin et al. |
| 8,693,895 B2 | 4/2014 | Yang et al. |
| 8,890,626 B2 | 11/2014 | Chen et al. |
| 2009/0167389 A1 * | 7/2009 | Reis .................... H03L 7/099 |
| | | 327/159 |
| 2011/0221494 A1 | 9/2011 | Chen et al. |
| 2012/0002967 A1 | 1/2012 | Mayer et al. |
| 2012/0092230 A1 | 4/2012 | Hung et al. |
| 2013/0234305 A1 | 9/2013 | Lin et al. |
| 2013/0285722 A1 | 10/2013 | Chou |
| 2014/0132333 A1 | 5/2014 | Jin et al. |
| 2014/0145769 A1 | 5/2014 | Lin |
| 2014/0217546 A1 | 8/2014 | Yen et al. |
| 2014/0253262 A1 | 9/2014 | Hsieh et al. |
| 2014/0253391 A1 | 9/2014 | Yen |
| 2015/0295582 A1 * | 10/2015 | El Moznine .......... H04L 7/0331 |
| | | 375/376 |

\* cited by examiner

PLL FOR CARRIER GENERATOR AND METHOD OF GENERATING CARRIER SIGNALS

PRIORITY CLAIM

The present application is a continuation of U.S. application Ser. No. 14/969,295, filed Dec. 15, 2015, which is incorporated herein by reference in its entirety.

BACKGROUND

In a packaged integrated circuit, there are many individual devices such as a memory, an analog-to-digital converter, wireless communication devices, an application processor, and so forth. The individual devices often communicate with via a bus such as Serial Peripheral Interface (SPI) or Inter-Integrated Circuit (I²C). Alternatively, some devices communicate via a radio frequency interconnect (RFI).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
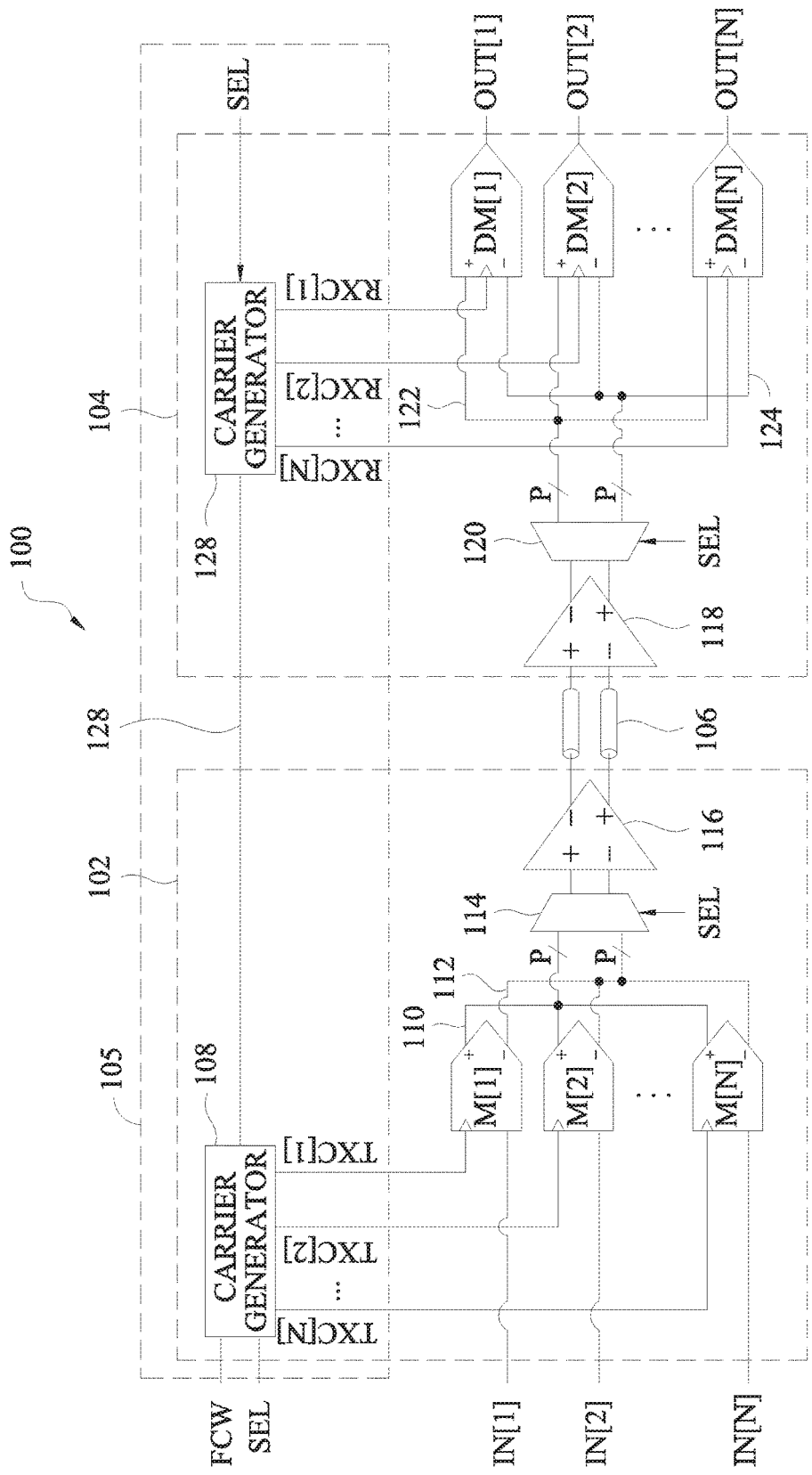
FIG. 1 is a block diagram of a Radio Frequency Interconnect (RFI) that connects devices, in accordance with some embodiments.

The following disclosure provides different embodiments, or examples, for implementing features of the provided subject matter. Specific examples of components and arrangements are described below to simplify the present disclosure. These are, of course, merely examples and are not limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The radio frequency interconnect (RFI) discussed herein connects individual components via a differential transmission line. In some embodiments, the individual components are on a single substrate. In some embodiments, the individual components are on separate substrates. In some embodiments, the individual devices include at least one of a memory device, a wireless communication device, e.g., a Bluetooth® module, a Zigbee® module, an IEEE 802.11 wireless networking module, or another suitable wireless communication device, an analog-to-digital converter, a digital-to-analog converter, a sensor module, a discrete application processor for performing operations in a low power state, a hardware processor, a memory controller, or another suitable device.

In some embodiments, a single device using a large bandwidth, e.g., a memory, is coupled to a processor via a differential transmission line. In some embodiments, two or more devices are coupled to the processor via a single differential transmission line. In some embodiments, the differential transmission line is a coplanar waveguide.

The RFI includes a transmitter and a receiver configured to link two or more devices via a transmission line to perform communication between or among the two or more devices. The RFI also includes a carrier synchronization section which includes a carrier generator configured to generate carrier signals and to generate a clock recovery signal from the carrier signals. The carrier signals are used to modulate data that is transmitted to at least one receiving device via the differential transmission line. A receiving device uses the clock recovery signal to regenerate the carrier signals and demodulate the received data via the regenerated carrier signals. In some embodiments, the receiver uses a phase locked loop (PLL) to generate the clock recovery signal. In some embodiments, the receiver uses a single PLL to generate the clock recovery signal. The RFI is usable in different integrated circuits that are packaged via a 2D, a 2.5D, or a 3D packaging technique, thereby conserving space by reducing a number of electrical interconnects relative to other techniques. Because the RFI replaces a bus having a large number of individual lines, the RFI helps to save power and reduce an area occupied on the integrated circuit.

FIG. 1 is a block diagram of a Radio Frequency Interconnect (RFI) 100 that connects devices, in accordance with some embodiments. RFI 100 includes a transmitter 102 that is coupled to a receiver 104 via a transmission line 106. RFI 100 also includes a carrier synchronization section 105 which connects transmitter 102 to receiver 104. Transmitter 102 includes data input terminals that are coupled to input data lines IN[1] to IN[N] (collectively referred to as "input data lines IN"), where N is a positive integer greater than or equal to 2. Receiver 104 includes output terminals that are coupled to output data lines OUT[1] to OUT[N], collectively referred to as "output data lines OUT."

Transmitter 102 includes a carrier generator 108 having a first input configured to receive a frequency command word (FCW) signal and a second input configured to receive a selector (SEL) signal. Carrier generator 108 includes clock output terminals that are coupled to clock input terminals of modulators M[1] to M[N] (collectively referred to as "modulators M") via carrier lines TXC[1] to TXC[N] (collectively referred to as "carrier lines TXC"), where N is a positive integer greater than or equal to 2. In some embodiments, carrier generator 108 includes a plurality of sub-carrier generators, where each sub-carrier generator is connected to a corresponding modulator of modulators M. In some embodiments, carrier generator 108 includes a multi-carrier generator connected to each of modulators M.

Modulators M include data input terminals that are coupled to the data input terminals of transmitter 102. Non-inverting output terminals of modulators M are coupled to a bus 110. Inverting output terminals of modulators M are coupled to a bus 112. Bus 110 has P bits (where P is a positive integer) and is coupled to a first set of input terminals of a multiplexer 114. Bus 112 also has P bits and is coupled to a second set of input terminals of multiplexer 114.

Multiplexer 114 includes a select input terminal coupled to an external select source (not shown) and differential output terminals that are coupled to differential input terminals of a differential amplifier 116. The select input terminal is configured to receive the SEL signal. The differential output terminals of differential amplifier 116 are coupled to the differential output terminals of transmitter 102, which are coupled to input ports of transmission line 106. In some embodiments, differential amplifier 116 is a low noise amplifier.

The output ports of transmission line 106 are coupled to differential input terminals of receiver 104, which are coupled to differential input terminals of a differential amplifier 118. In some embodiments, differential amplifier 118 is a low noise amplifier. The output terminals of differential amplifier 118 are coupled to input terminals of a demultiplexer 120. A first set of output terminals of demultiplexer 120 are coupled to a bus 122 having P bits and a second set of output terminals of demultiplexer 120 are coupled to a bus 124 having P bits.

Receiver 104 includes a carrier generator 126 having clock output terminals that are coupled to a clock input of demodulators DM[1] to DM[N] (collectively referred to as "demodulators DM") via carrier lines RXC[1] to RXC[N] (collectively referred to as "carrier lines RXC"), where N is a positive integer greater than or equal to 2. Non-inverting input terminals of demodulators DM are also coupled to bus 122 and inverting input terminals of demodulators DM[N] are coupled to bus 124. Output terminals of demodulators DM are coupled to the output terminals of receiver 104, which are coupled to the data output lines OUT. Carrier generator 126 is configured to receive the SEL signal. In some embodiments, carrier generator 126 includes a plurality of sub-carrier generators, where each sub-carrier generator is connected to a corresponding demodulator of demodulators DM. In some embodiments, carrier generator 126 includes a multi-carrier generator connected to each of demodulators DM.

A clock output terminal of carrier generator 108 is also coupled to a clock input terminal of carrier generator 126 via line 128. In some embodiments, line 128 is a single ended line for transmitting a clock recovery signal to receiver 104 to regenerate the carrier signals S.

Transmitter 102 is configured receive input data via input data lines IN, modulate the input data based on a different carrier signal for each of the input data lines IN, and transmit the modulated data to receiver 104. For example, the carrier generator 108 receives the FCW signal on the first input terminal and the SEL signal on the second input terminal. The SEL signal is configured to divide a time period $T_{PERIOD}$ into time slots T[1] to T[N] (collectively referred to as "time slots T"), where N is a positive integer greater than or equal to 2. In response to the FCW signal, carrier generator 108 is configured to generate carrier frequencies S[1] to S[N] (collectively referred to as "carrier signals S"), where N is a positive integer greater than or equal to 2.

Carrier generator 108 is also configured to output the carrier frequencies S to the clock input terminals of modulators M. For example, based on the FCW signal and modulator M[n], where n is a positive integer ranging from 1 to N, carrier generator 108 generates a carrier signal S[n] and transmits the carrier signal S[n] to the modulator M[n] via carrier line TXC[n]. In some embodiments, the FCW signal is a ratio of a desired frequency divided by a reference frequency. In some embodiments, each of the carrier signals S on the carrier lines TXC is a continuous wave signal having a different fundamental frequency.

Carrier generator 108 is also configured to generate a clock recovery signal $S_{REF}$ by time-multiplexing each of the carrier signals S for a predetermined interval, i.e., a time slot, in time period $T_{PERIOD}$, with time period $T_{PERIOD}$ being divided into time slots T. Specifically, based on the SEL signal, carrier generator 108 sequentially outputs a carrier signal S[n] in a time slot T[n], thereby causing carrier generator 108 to time-multiplex the carrier signals S into the clock recovery signal $S_{REF}$. Clock recovery signal $S_{REF}$ is output from carrier generator 108 on line 128 to carrier generator 126.

Modulator M[n] receives the data for transmission via input line IN[n] for transmission to receiver 104. In response to receiving the carrier signal S[n] on the clock input terminal, modulator M[n] modulates the input data based on the carrier signal on carrier line TXC[n], and outputs the modulated data as a differential signal on bus 110 and bus 112. The modulator M[n] is configured to modulate the input data based on a Quadrature Amplitude Modulation (QAM) scheme having 256 symbols (i.e., 256-QAM). In other embodiments, another modulation scheme is used or a different number of symbols is implemented (e.g., 64-QAM, 1024-QAM). In some embodiments, a phase shift key scheme is implemented to improve noise performance.

Multiplexer 114 receives the modulated data from modulators M via bus 110 and 112 and receives the SEL signal via the select input terminal. In response to the SEL signal, multiplexer 114 selects modulator M[n] for a time slot T[n] and outputs the modulated data from the selected modulator M[n] during the time slot T[n]. As a result, multiplexer 114 receives the modulated data from each modulator M, time-multiplexes the modulated data for each modulator M during time period $T_{PERIOD}$, and outputs the multiplexed data. Differential amplifier 116 receives the multiplexed data, amplifies the time-multiplexed data for transmission, and transmits the amplified data to receiver 104 via the transmission line 106.

Receiver 104 is configured to demodulate the received data from the transmitter 102 by regenerating the carrier signals S. Specifically, carrier generator 126 receives the clock recovery signal $S_{REF}$ on line 128 via the first input terminal and the SEL signal via the second input terminal. In response to the clock recovery signal $S_{REF}$ and the SEL signal, carrier generator 126 regenerates the carrier signals S and outputs the carrier signals S on the carrier lines RXC.

The differential input terminals of differential amplifier 118 receive the transmitted data from transmitter 102 via output ports of transmission line 106. In response to receiving the data, differential amplifier 118 amplifies the received data and outputs the amplified data. Demultiplexer receives the amplified data via the differential input terminals and receives the SEL signal via the select input terminal.

In response to the SEL signal during each time period $T_{PERIOD}$, demultiplexer 120 sequentially selects and outputs the amplified signal to demodulators DM via bus 122 and bus 124. For example, during time slot T[n], demultiplexer 120 selects an output terminal coupled to bus 122 that is coupled to the non-inverting input of demodulator DM[n] and an output terminal coupled to bus 124 that is coupled to the inverting input terminal of demodulator DM[n]. In response to selecting the output terminals, demultiplexer 120 outputs the amplified signal to the selected demodulator DM[n] during the corresponding time slot T[n]. Demodulators DM receive the amplified signal for a single time slot from the time slots T and receive the carrier signals S on carrier lines RXC. In response to receiving the amplified signal, demodulators DM demodulate the amplified signal based on the carrier signals S and output the transmitted data on data output lines OUT.

Figure 2:
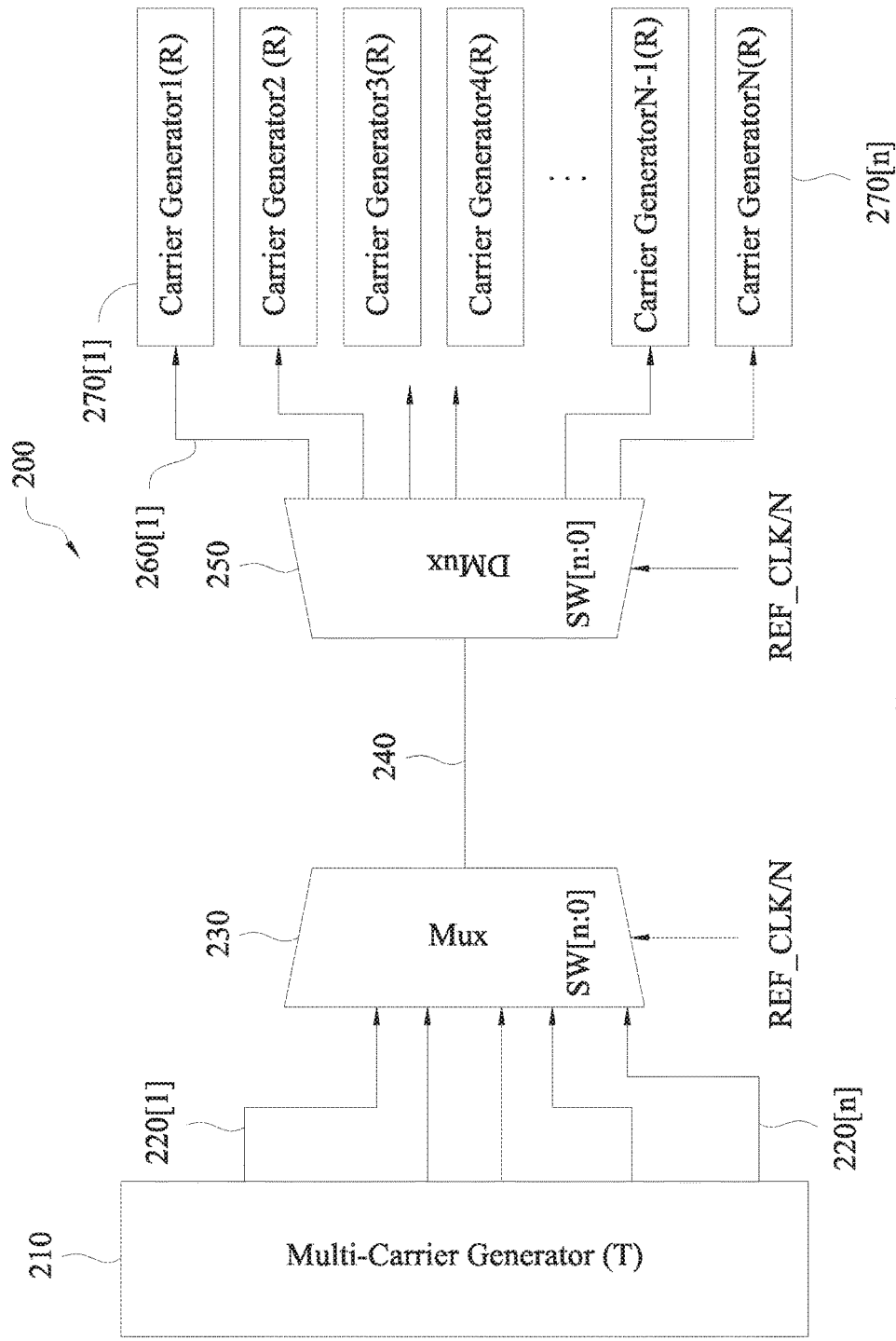
FIG. 2 is a block diagram of a carrier synchronization section of an RFI, in accordance with some embodiments.

FIG. 2 is a block diagram of a carrier synchronization section 200 of an RFI, in accordance with some embodiments. In some embodiments, carrier synchronization section 200 is usable as carrier synchronization section 105 in RFI 100 (FIG. 1). Carrier synchronization section 200 includes a multi-carrier generator 210. Multi-carrier generator 210 is configured to generate a reference carrier signal. Multi-carrier generator 210 is connected to a multiplexer 230 by a plurality of lines 220 [1] to 220[n], collectively referred to as lines 220. Multi-carrier generator 210 is also configured to generate carrier signals for modulators in the RFI, e.g., modulators M in RFI 100. A selector input of multiplexer 230 is configured to receive a divided reference clock signal REF_CLK/N. Multiplexer 230 is configured to transmit reference carrier signals from multi-carrier generator 210 along a line 240 in a time division multiplexing scheme. In some embodiments, multi-carrier generator 210 is separated into a plurality of carrier generators. In some embodiments, multi-carrier generator 210, lines 220 and multiplexer 230 are combined into a single carrier generator arrangement, e.g., carrier generator 108 (FIG. 1).

Line 240 connects multiplexer 230 with a demultiplexer 240. Demultiplexer 240 is configured to receive the divided reference clock signal REF_CLK/N at a selector input. Demultiplexer 240 is configured to output separated reference carrier signals to corresponding carrier generators 270[1] to 270[n], collectively referred to as carrier generators 270, along lines 260[1] to 260[n], collectively referred to as lines 260. Carrier generators 270 are configured to output carrier signals to demodulators of the RFI, e.g., demodulators DM of RFI 100 (FIG. 1). In some embodiments, carrier generators 270 are combined into a single multi-carrier generator. In some embodiments, carrier generators 270, lines 260 and demultiplexer 250 are combined into a single carrier generator arrangement, e.g., carrier generator 126 (FIG. 1).

Figure 3:
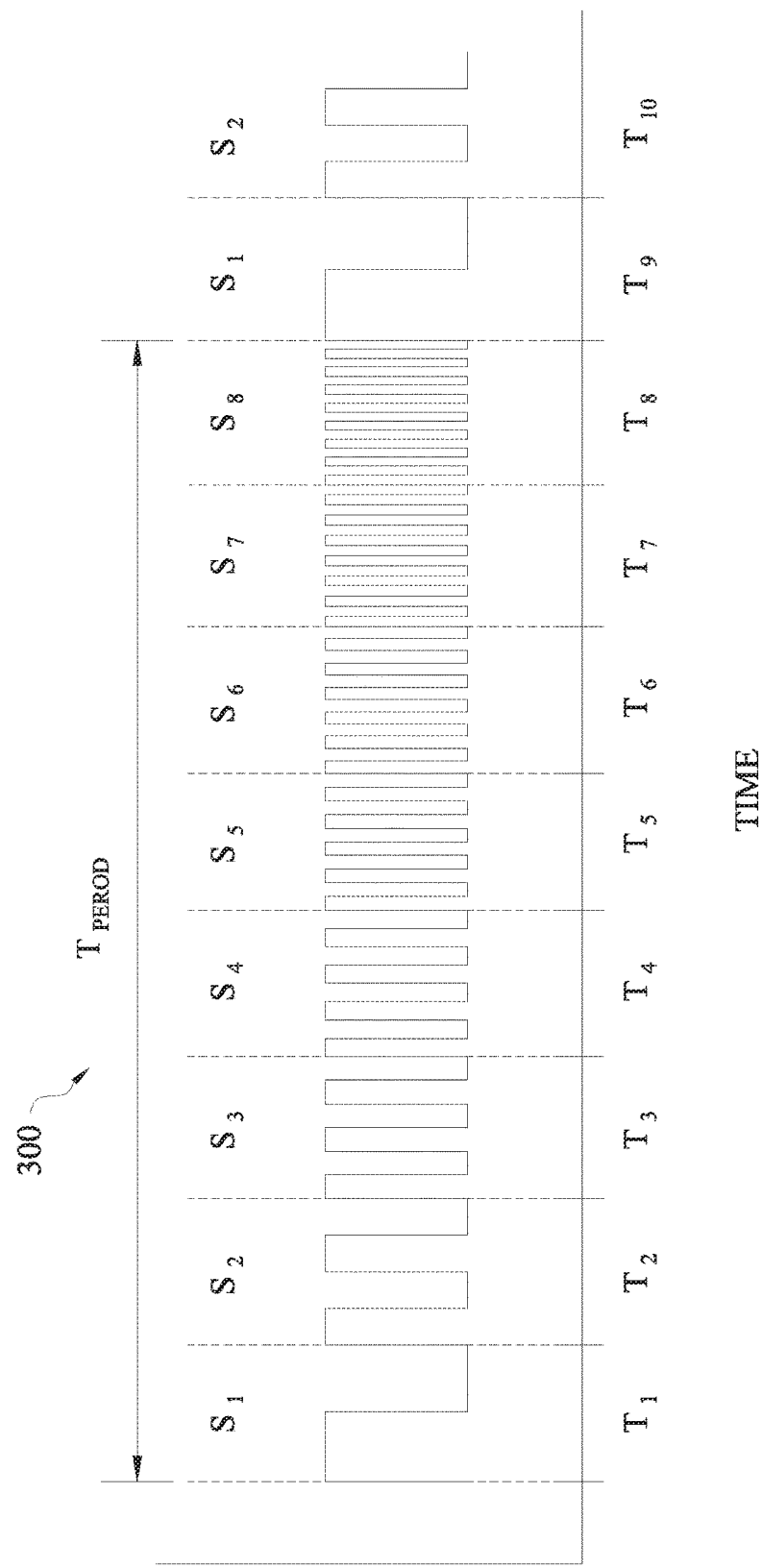
FIG. 3 is a timing diagram of a clock recovery signal SREF generated by a carrier generator of an RFI, in accordance with some embodiments.

FIG. 3 is a timing diagram 300 of a clock recovery signal $S_{REF}$ generated by a carrier generator of an RFI in accordance with some embodiments. In some embodiments, clock recovery signal $S_{REF}$ is generated by multi-carrier generator 210, lines 220 and multiplexer 230 (FIG. 2). In some embodiments, clock recovery signal $S_{REF}$ is generated by carrier generator 108 (FIG. 1).

Clock recovery signal $S_{REF}$ includes reference carrier signals S that are time-multiplexed and transmitted during every time period $T_{PERIOD}$, which is divided into time slots T. Each time slot T[n] in time slots T has a substantially equal time duration and carries a single reference carrier signal S[n] from carrier signals S, and each of the reference carrier signals S has a different frequency. In some embodiments, any one of reference carrier signals S is another continuous wave signal, e.g., a sinusoidal waveform, a triangle waveform, or another suitable waveform. After time period $T_{PERIOD}$ (i.e., time period T[N+1]), clock recovery signal $S_{REF}$ is continually generated and transmitted beginning with carrier signal S[1] at time period T[N+1]. In some embodiments, at least one time slot T[n] has a different time duration from at least another time slot.

Figure 4:
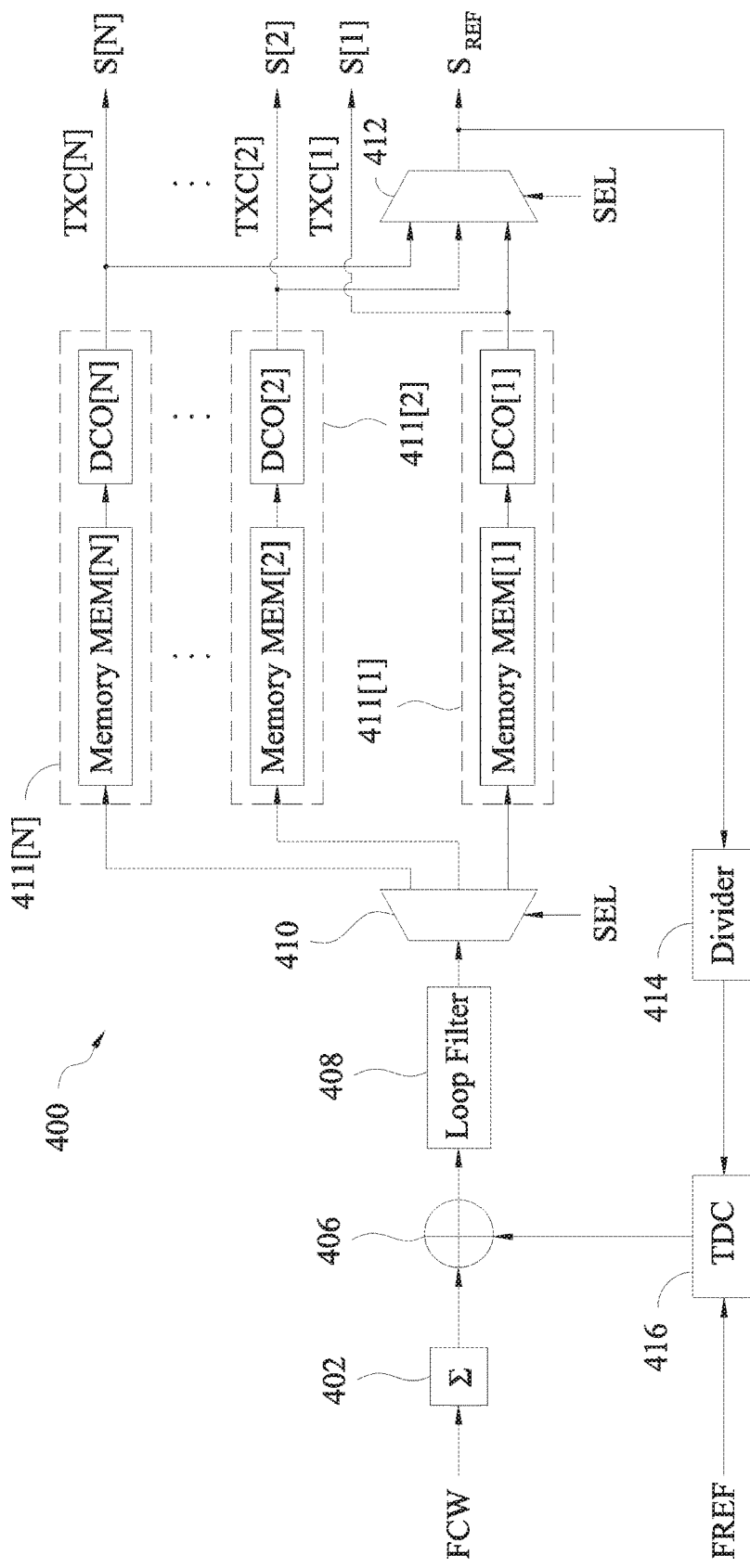
FIG. 4 is a block diagram of a carrier generator for generating carrier signals and for generating a clock recovery signal in an RFI, in accordance with some embodiments.

FIG. 4 is a block diagram of a carrier generator 400 for generating carrier signals S and for generating a clock recovery signal $S_{REF}$ in an RFI, in accordance with some embodiments. In some embodiments, the RFI is RFI 100 (FIG. 1). In some embodiments, carrier generator 400 is usable as multi-carrier generator 210 (FIG. 2). Carrier generator 400 includes a PLL for each carrier signal. The PLL helps to increase an amplitude of the clock recovery signal $S_{REF}$ in order to account for signal loss during transmission along a line of the RFI, e.g., line 128 (FIG. 1). The PLL also helps to account for phase shift in the received clock signal resulting from transmission through the line of the RFI. In some embodiments, carrier generator 400 includes an all-digital PLL (ADPLL). In some embodiments, carrier generator includes at least one analog component, such as a voltage controlled oscillator (VCO).

Carrier generator 400 includes a first input terminal coupled to an input terminal of a phase accumulator 402. An output terminal of phase accumulator 402 is coupled to a first input of an adder 406. An output terminal of adder 406 is coupled to an input terminal of a loop filter 408. An output terminal of loop filter 408 is coupled to an input terminal of a demultiplexer 410. Demultiplexer 410 includes a select input terminal for receiving an SEL signal and output terminals that are coupled to an input terminal of tuning arrangements 411[1] to 411[N] (collectively referred to as "tuning arrangements 411"), where N is a positive integer greater than 2. An output of each tuning arrangement 411 is provided to a corresponding clock output terminal of carrier generator 400, which is coupled to carrier lines TXC.

Each tuning arrangement 411 includes a corresponding memory MEM[1] to MEM[N] (collectively referred to as "memory MEM"), where N is a positive integer greater than or equal to 2, and a corresponding digitally controlled oscillator DCO[1] to DCO[N] (collectively referred to as "oscillators DCO"), where N is a positive integer greater than or equal to 2. The input terminal of each tuning arrangement 411 is coupled to an input terminal of a corresponding memory MEM. Output terminals of memories MEM are coupled to input terminals of corresponding oscillators DCO. The output terminals of oscillators DCO are coupled to the output terminals of the tuning arrangements 411, which are coupled to the carrier lines TXC. In some embodiments, one or more of the oscillators DCO are replaced by a voltage controlled oscillator (VCO) for an analog circuit arrangement. The oscillators DCO are used to provide adjustment of the phase of the carrier signals S output to the carrier lines TXC.

Output terminals of the tuning arrangements 411 are also coupled to input terminals of a multiplexer 412. An output terminal of multiplexer 412 is coupled to a reference output terminal of the carrier generator 400. The output terminal of multiplexer 412 is also coupled to an input terminal of a divider 414. An output terminal of divider 414 is coupled to a first input terminal of a time-to-digital converter (TDC) 416. Carrier generator 400 includes a second input terminal that is coupled to a second input terminal of TDC 416. An output terminal of TDC 416 is coupled to a second input terminal of adder 406.

Including multiple tuning arrangements 411 enables carrier generator 400 to provide carrier signals S to multiple modulators M with a reduced circuit size in comparison with other approaches. In some embodiments, each carrier generator includes a single tuning arrangement 411. However, by sharing phase accumulator 402, adder 406, loop filter 408, demultiplexer 410, multiplexer 412, divider 414 and TDC 416 across multiple tuning arrangements 411, carrier generator 400 has a reduced size in comparison with other approaches. For example, an RFI which includes multiple carrier generators and each carrier generator has a separate PLL; a total size of the carrier generator is greater than carrier generator 400.

In operation, phase accumulator 402 receives the FCW signal via the first input terminal. In response to the FCW signal, phase accumulator 402 generates a phase reference signal based on the FCW and outputs the phase reference signal. Adder 406 receives the phase reference signal via the first input terminal and a feedback signal generated by TDC 416 via the second input terminal. In response to the phase reference signal and the feedback signal, adder 406 adds the phase reference signal to the feedback signal to generate a frequency command signal, and outputs the frequency command signal. Loop filter 408 receives the frequency command signal, filters the frequency command signal, and outputs the filtered command signal. In some embodiments, loop filter 408 is a low pass filter configured to pass frequencies below a threshold cutoff frequency. In some embodiments, the threshold cutoff frequency is determined based on an operating frequency of carrier generator 400.

Demultiplexer 410 receives the filtered command signal via the input terminal and receives the SEL signal via the select input terminal. In response to the SEL signal, demultiplexer 410 selects a tuning arrangement 411[$n$] (where n is a positive integer ranging from 1 to N) to receive the filtered command signal based a time slot T[n] indicated in the SEL signal, and outputs the filtered command signal on the output terminal coupled to the selected tuning arrangement 411[$n$]. The memory MEM[n] of the selected tuning arrangement 411[$n$] receives the filtered command signal. In some embodiments, memory MEM[n] stores data associated with the filtered command signal. In some embodiments, MEM[n] stores data associated with adjusting a frequency of the filtered command signal. For example, based on a given voltage at a given temperature or a range of temperatures, MEM[n] reads out data for adjusting the frequency of the filtered command signal. In some embodiments, the stored data is based on empirical data obtained by operating carrier generator 400. In some embodiments, the stored data is based on input from a user. In some embodiments, the stored data is based on a simulation of the operation of carrier generator 400. In some embodiments, the stored data is based on a combination of empirical data, user input data and/or simulation data. In some embodiments, the stored data is updated either periodically or continuously to help account for drift in carrier generator 400 or changes in a transmission line connected to the carrier generator.

The selected oscillator DCO [n] of the selected tuning arrangement 411[$n$] uses the data stored in the memory M[n] to correct the filtered command signal and to generate carrier signal S[n] based on the corrected filtered command signal. Because the carrier signal S[n] is based on the corrected filtered command signal, the selected tuning arrangement 411[$n$] outputs a carrier signal S[n] that has a corrected frequency and a corrected phase regardless of process variation, temperature, or another parasitic component that might have an effect on the operation of oscillator DCO[n]. By including memory MEM[n] to store data for correcting a filtered command signal, a precision of carrier signal S[n] is increased with respect to approaches which do not include memory MEM[n].

While the carrier generator 400 is operational, each tuning arrangement 411 is configured to continually output a respective carrier signal S[n]. Based on the SEL signal, each memory MEM[n] of a selected tuning arrangement 411[$n$] is configured to receive the filtered command signal during a time slot T[n] in time period $T_{PERIOD}$ for correcting the carrier signal S[n] generated and output by a corresponding oscillator DCO[n]. In some embodiments, the tuning arrangements 411 sequentially receive the filtered command signal during each time period $T_{PERIOD}$.

Multiplexer 412 receives the carrier signals S via carrier lines TXC and the SEL signal via the select terminal. In response to the SEL signal, multiplexer 412 sequentially selects a single carrier signal S[n]. That is, during time period $T_{PERIOD}$, multiplexer 412 time-multiplexes carrier signals S into the clock recovery signal $S_{REF}$, and outputs the clock recovery signal $S_{REF}$. In some embodiments, clock recovery signal $S_{REF}$ is an output from multiplexer 412 to a single-ended line and provides a reference clock for the receiver 104 (FIG. 1). In some embodiments, the SEL signal received by demultiplexer 410 and multiplexer 412 is a same signal. In some embodiments, the SEL signal received by multiplexer 412 is delayed with respect to the SEL signal received by demultiplexer 410 to account for delay of a signal propagating through tuning arrangements 411.

Divider 414 also receives the clock recovery signal $S_{REF}$, divides the clock recovery signal $S_{REF}$ by a division integer, and outputs the divided signal. In some embodiments, the division integer is a fixed integer. In some embodiments, the division integer is programmable integer and is determined from an input control signal such as the SEL signal or a user input.

TDC 416 receives the divided clock signal and also receives a frequency reference (FREF) signal via the second input terminal. In response to the frequency reference FREF and the divided signal, TDC 416 generates a feedback signal to correct the phase of oscillators DCO. TDC 416 converts the frequency of the frequency reference FREF and the divided clock signal into a digital feedback signal. TDC 416 outputs the feedback signal to the adder 406, which receives the feedback signal to add to the phase reference signal from adder 402.

Figure 5:
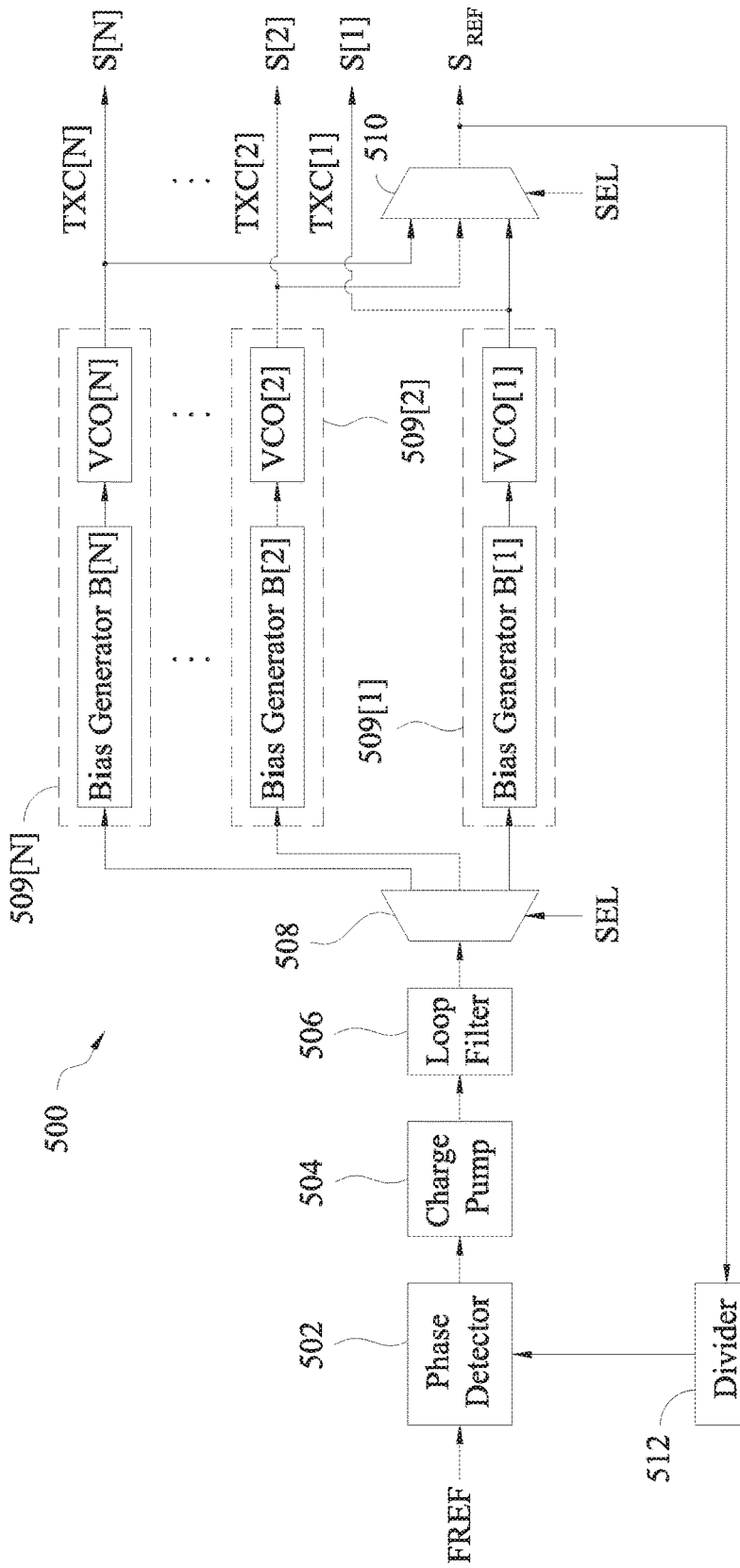
FIG. 5 is a block diagram of a carrier generator for generating carrier signals and for generating a clock recovery signal in an RFI, in accordance with some embodiments.

FIG. 5 is a block diagram of a carrier generator 500 for generating carrier signals S and for generating a clock recovery signal $S_{REF}$ in an RFI, in accordance with some embodiments. In some embodiments, the RFI is RFI 100 (FIG. 1). In some embodiments, carrier generator 500 is usable as multi-carrier generator 210 (FIG. 2). Carrier generator 500 includes a PLL for each carrier signal, similar to that discussed with respect to carrier generator 400 (FIG. 4).

Carrier generator 500 includes a first input terminal coupled to an input terminal of a phase detector 502. An output terminal of phase detector 502 is coupled to an input terminal of a charge pump 504. An output terminal of charge pump 504 is coupled to an input terminal of a loop filter 506. In some embodiments, loop filter 506 is a low pass filter configured to pass frequencies below a threshold cutoff frequency. An output terminal of loop filter 506 is coupled to an input terminal of a demultiplexer 508.

Demultiplexer 508 includes a select input terminal for receiving an SEL signal and output terminals that are coupled to an input terminal of tuning arrangements 509[1] to 509[N] (collectively referred to as "tuning arrangements 509"), where N is a positive integer greater than 2. An output of each tuning arrangement 509 is provided to a corresponding clock output terminal of carrier generator 500, which is coupled to carrier lines TXC, for supplying carrier signals to modulators, e.g., modulators M[N] (FIG. 1).

Each tuning arrangement 509 includes corresponding bias generators B[1] to B[N] (collectively referred to as "bias generators B"), where N is a positive integer greater than or equal to 2, and a corresponding voltage controlled oscillators VCO[1] to VCO[N] (collectively referred to as "oscillators VCO"), where N is a positive integer greater than or equal to 2. The input terminal of each tuning arrangement 509 is coupled to an input terminal of a bias generator B. Output terminals of bias terminals B are coupled to input terminals of corresponding oscillators VCO. The output terminals of oscillators VCO are coupled to the output terminals of the tuning arrangements 509, which are coupled to the carrier lines TXC. The oscillators VCO are used to provide coarse adjustment of the carrier signals S output to the carrier lines TXC. In some embodiments, oscillators VCO are replaced with digitally controlled oscillators (DCO) for a digital circuit design.

Output terminals of the tuning arrangements 509 are also coupled to input terminals of a multiplexer 510. Multiplexer 510 includes a control input and an output terminal that is connected to a reference output terminal of the carrier generator 500. The output terminal of multiplexer 510 is also coupled to an input terminal of a divider 512. An output terminal of divider 512 is coupled to a second input terminal of phase detector 502.

Including multiple tuning arrangements 509 enables carrier generator 500 to provide carrier signals S to multiple modulators M with a reduced circuit size in comparison with other approaches. In some embodiments, each carrier generator includes a single tuning arrangement 509. However, by sharing phase detector 502, charge pump 504, loop filter 506, demultiplexer 508, multiplexer 510, and divider 512 across multiple tuning arrangements 509, carrier generator 500 has a reduced size in comparison with other approaches. For example, an RFI which includes multiple carrier generators and each carrier generator includes a separate PLL; a total size of the carrier generator is greater than carrier generator 500.

In operation, phase detector 502 receives a reference frequency signal FREF via the first input terminal of the carrier generator 500. Phase detector 502 also receives a phase error signal from divider 512 via the second terminal. Based on the reference frequency signal FREF and the phase error signal, phase detector 502 generates a correction signal and outputs the correction signal via the output terminal. In response to receiving the correction signal, charge pump 504 generates and outputs a current pulse signal. Charge pump 504 converts correction signal from a digital signal to an analog signal. In some embodiments, which include DCO in place of VCO, charge pump 504 is omitted. Loop filter 506 receives the current pulse signal and, in response to receiving the current pulse signal, generates and outputs an oscillator control signal. In some embodiments where loop filter 506 is a low-pass filter, loop filter 506 filters out high frequencies above the predetermined threshold. Demultiplexer 508 receives the oscillator control signal via the first input terminal and the SEL signal via the select terminal. In response to the SEL signal, demultiplexer 508 selects a tuning arrangement 509[n] (where n is a positive integer ranging from 1 to N) to receive the oscillator control signal based a time slot T[n] indicated in the SEL signal, and outputs the oscillator control signal on the output terminal coupled to the selected tuning arrangement 509[n].

The bias generator B[n] of the selected tuning arrangement 509[n] receives the oscillator control signal. In response to the oscillator control signal, bias generator B[n] generates a bias value to combine with the oscillator control signal and outputs the biased oscillator control signal to the input terminal of oscillator VCO[n] of the selected tuning arrangement 509[n]. The bias value generated by bias generator B[n] is, for example, based on a given voltage at a given temperature or a range of temperatures. In some embodiments, the bias value is based on empirical data obtained by operating carrier generator 500. In some embodiments, the bias value is based on input from a user. In some embodiments, the bias value is based on a simulation of the operation of carrier generator 500. In some embodiments, the bias value is based on a combination of empirical data, user input data and simulation data. In some embodiments, the bias value is updated either periodically or continuous to help to account for drift in carrier generator 500 or changes in a transmission line connected to the carrier generator In some embodiments, oscillator VCO[n] uses the biased oscillator control signal to adjust a phase of carrier signal S[n] output by the oscillator VOC. Using the biased oscillator control signal helps to ensure oscillator VCO[n] outputs a carrier signal S with a correct frequency and phase regardless of process variation, temperature, or another parasitic component that might have an effect on the operation of oscillator VCO[n].

While the carrier generator 500 is operational, each tuning arrangement 509 is configured to continually output a respective carrier signal S[n]. Based on the SEL signal, each bias generator B[n] of a selected tuning arrangement 509[n] is configured to receive the oscillator control signal during a time slot T[n] in time period $T_{PERIOD}$ for correcting the carrier signal S[n] generated and output by a corresponding oscillator VCO[n]. In some embodiments, each of the tuning arrangements 509 sequentially receives an oscillator control signal during each time period $T_{PERIOD}$.

Multiplexer 510 receives carrier signals S via the input terminals and the SEL signal on the select terminal. In response to the SEL signal, multiplexer 510 sequentially selects and outputs each of the carrier signals S during the time period $T_{PERIOD}$. That is, multiplexer 510 time-multiplexes the carrier signals S into the clock recovery signal $S_{REF}$, and output the clock recovery signal $S_{REF}$. In some embodiments, multiplexer 510 outputs the clock recovery signal $S_{REF}$ via a single-ended line to provide a reference clock for the receiver 104 (FIG. 1). In some embodiments, the SEL signal received by demultiplexer 508 and multiplexer 510 is a same signal. In some embodiments, the SEL signal received by multiplexer 510 is delayed with respect to the SEL signal received by demultiplexer 508 to account for delay of a signal propagating through tuning arrangements 509.

The output terminal of multiplexer 510 also provides clock recovery signal $S_{REF}$ to divider 512. In response to receiving the clock recovery signal $S_{REF}$, divider 512 divides the clock recovery signal $S_{REF}$ by a division integer, and outputs the divided signal. In some embodiments, the division integer is a fixed integer. In some embodiments, the division integer is programmable integer and is determined from an input control signal such as the SEL signal. Divider 512 provides the divided signal to phase detector 502. In response to receiving the divided signal, phase detector 502 compares the reference signal FREF and the divided signal to determine an amount of correction, generates the phase error signal corresponding to the correction amount, and outputs the phase error signal.

Figure 6:
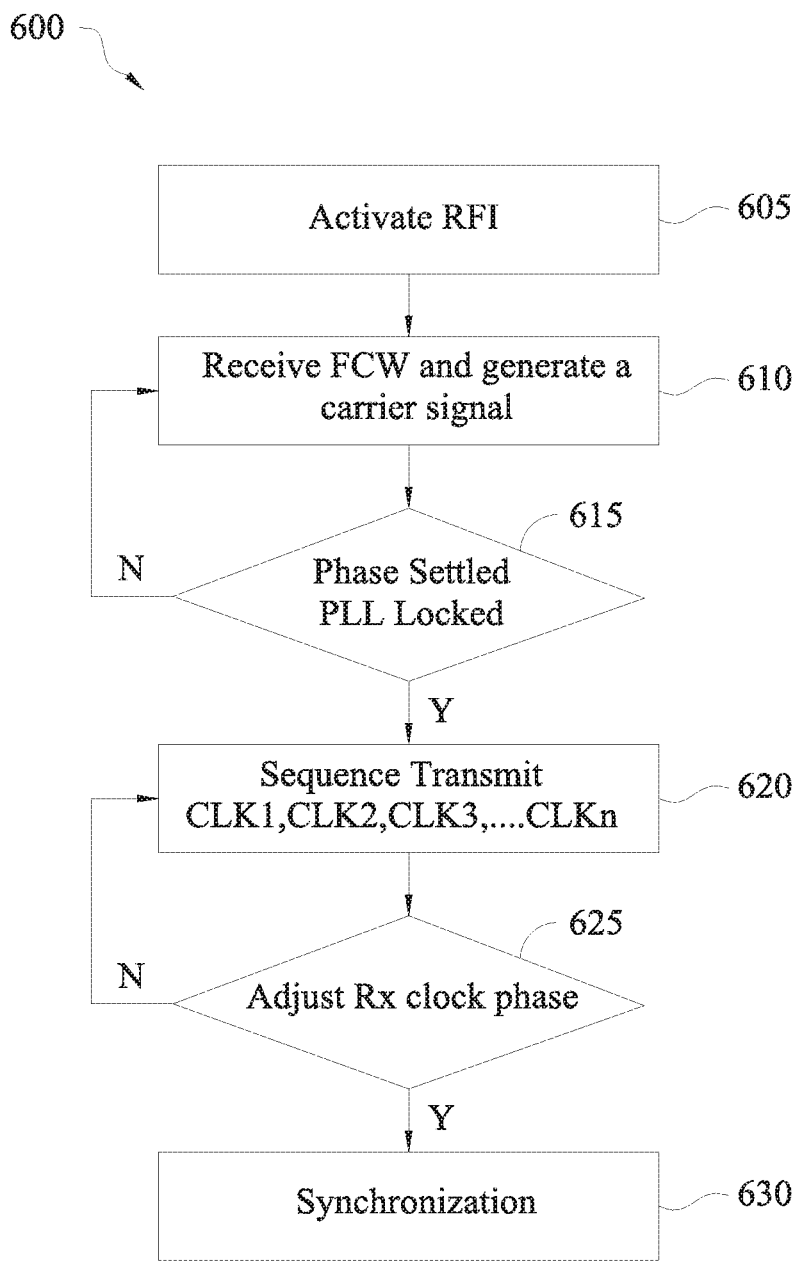
FIG. 6 is a flowchart of a method of synchronizing a transmitter and a receiver for transmission of data in an RFI, in accordance with some embodiments.

FIG. 6 is a flowchart of a method 600 of synchronizing a transmitter and a receiver for transmission of data in an RFI, in accordance with some embodiments. In some embodiments, method 600 is applicable to the circuits and signals illustrated in conjunction with RFI 100 (FIG. 1), carrier synchronization section 200 (FIG. 2), carrier generator 400 (FIG. 4), or carrier generator 500 (FIG. 5).

In step 605, an RFI is activated. For a period of time following activation of the RFI a transmitter, e.g., transmitter 102 (FIG. 1), and a receiver, e.g., receiver 104, will be out of sync. During this start-up period, a PLL of a carrier generator, e.g., carrier generator 108 (FIG. 1), multi-carrier generator 210 (FIG. 2), carrier generator 400 (FIG. 4), or carrier generator 500 (FIG. 5), will attempt to lock the carrier signal output to modulators of the RFI to the FCW with received clock signals based on a reference signal.

In step 610, a frequency source, such as a carrier generator, receives a FCW and generates a carrier signal based on the FCW. The FCW is an estimate of an input frequency. The carrier generator, e.g., carrier generator 108 (FIG. 1), multi-carrier generator 210 (FIG. 2), carrier generator 400 (FIG. 4), or carrier generator 500 (FIG. 5), will attempt to lock the carrier signal output to modulators of the RFI to the FCW. In step 610, the frequency source corrects the frequency and the phase of the carrier signal. In step 610, data to be transmitted to a receiver is modulated using the carrier signals output to the modulators of a transmitter of the RFI.

In step 615, the carrier signals output to modulators are compared with the FCW to determine whether the PLL of the carrier generator has successfully locked the carrier signal to the FCW. If the comparison made in step 615 indicates that the PLL has not successfully locked the carrier signal to the FCW, then method 600 returns to step 610. If the comparison made in step 615 indicates that the PLL has successfully locked the carrier signal to the FCW, then method 600 continues to step 620. In some embodiments, the comparison made in step 615 indicates that the carrier signal is locked to the FCW if an error between a frequency and a phase of the carrier signal and a frequency and a phase of the FCW is within a predetermined range. In some embodiments, the predetermined range is selected by a user. In some embodiments, the predetermined range is based on a frequency of the FCW. In some embodiments, a counter is used to determine number of iterations of step 615 in method 600. If the number of comparisons exceeds a threshold value, indicating the PLL is on a runaway, and unlikely to lock the carrier signal to the FCW, then the RFI is restarted and the counter is reset to zero. Runaway occurs when a frequency of an output of PLL is so high that a divider in the PLL fails to accurately respond to the output frequency, i.e., an output frequency that is too high causes a PLL to diverge from the FCW instead of converging to the FCW, in some instances.

In step 620, a clock recovery signal is generated and transmitted. The clock recovery signal is transmitted within the RFI in a time division multiplexing scheme. The clock recovery signal includes a plurality of clock signals, e.g., CLK1, CLK2, CK3, CLKn. Each clock signal is transmitted within a corresponding time slot, e.g., time slots T1-T8 (FIG. 3), from the transmitter to the receiver of the RFI.

In step 625, a carrier generator of the receiver adjusts carrier signals based on the received clock recovery signal. After adjusting the carrier signal, a determination is made in step 625 whether the frequency and the phase of the carrier signal are settled within a predetermined range of the received clock recovery signal. If the frequency and the phase of the carrier signal are not settled within the predetermined range of the received clock recovery signal, the method returns to step 620 to continue transmitting and receiving the clock recovery signal. If the frequency and the phase of the regenerated carrier signal are settled within the predetermined range of the received clock recovery signal, the method proceeds to step 630.

In step 630, the a determination is made that the carrier signals of the receiver are synchronized with the carrier signals of the transmitter and, therefore, data transmission can begin because the receiver is able to precisely demodulate the transmitted data using the carrier signals of the receiver.

In some embodiments, a PLL for a carrier generator includes a front-end circuit configured to receive a frequency reference signal and generate a control signal based on the frequency reference signal and a feedback signal, and a demultiplexer configured to selectively output the control signal to a plurality of tuning arrangements. The plurality of tuning arrangements includes a first tuning arrangement configured to generate a first carrier signal based on the control signal and a second tuning arrangement configured to generate a second carrier signal based on the control signal. A multiplexer is configured to output the feedback signal based on the first carrier signal and the second carrier signal.

In some embodiments, a carrier generator includes a front-end circuit configured to receive a frequency reference signal and a feedback signal, and generate a control signal based on the frequency reference signal and the feedback signal. The carrier generator includes a carrier signal circuit including a plurality of tuning arrangements, the carrier signal circuit being configured to receive the control signal and a selector signal, selectively distribute the control signal to the plurality of tuning arrangements based on the selector signal, generate a plurality of carrier signals with the plurality of tuning arrangements based on the control signal, and generate the feedback signal from the plurality of carrier signals based on the selector signal.

In some embodiments, a method of generating a plurality of carrier signals includes generating, using a front-end circuit, a control signal based on a frequency reference signal and a feedback signal, receiving the command signal at a plurality of tuning arrangements, generating, with the plurality of tuning arrangements, a plurality of carrier signals, and generating the feedback signal by time-multiplexing the plurality of carrier signals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase locked loop (PLL) for a carrier generator, the PLL comprising:
   a front-end circuit configured to receive a frequency reference signal and generate a control signal based on the frequency reference signal and a feedback signal;
   a demultiplexer configured to selectively output the control signal to a plurality of tuning arrangements, the plurality of tuning arrangements comprising:

a first tuning arrangement configured to generate a first carrier signal based on the control signal; and
a second tuning arrangement configured to generate a second carrier signal based on the control signal; and
a multiplexer configured to output the feedback signal based on the first carrier signal and the second carrier signal.

2. The PLL of claim 1, wherein the front-end circuit comprises a divider configured to receive the feedback signal and divide the feedback signal by a programmable integer.

3. The PLL of claim 2, wherein
the divider is configured to generate a divided feedback signal from the feedback signal, and
the front-end circuit further comprises a time-to-digital converter configured to generate a digital feedback signal from the frequency reference signal and the divided feedback signal.

4. The PLL of claim 3, wherein the front-end circuit further comprises:
a phase accumulator configured to receive a frequency command word and generate a phase reference signal based on the frequency command word; and
an adder configured to generate a frequency command signal from the phase reference signal and the digital feedback signal.

5. The PLL of claim 2, wherein
the divider is configured to generate a phase error signal from the feedback signal, and
the front-end circuit further comprises a phase detector configured to generate a correction signal based on the frequency reference signal and the phase error signal.

6. The PLL of claim 1, wherein
the control signal is a filtered frequency command signal, and
each of the first tuning arrangement and the second tuning arrangement comprises a memory having stored therein data associated with adjusting a frequency of the filtered frequency command signal.

7. The PLL of claim 1, wherein
the control signal is an oscillator control signal, and
each of the first tuning arrangement and the second tuning arrangement comprises a bias generator circuit configured to combine a bias value with the oscillator control signal.

8. A carrier generator comprising:
a front-end circuit configured to
receive a frequency reference signal and a feedback signal, and
generate a control signal based on the frequency reference signal and the feedback signal; and
a carrier signal circuit comprising a plurality of tuning arrangements, the carrier signal circuit being configured to
receive the control signal and a selector signal,
selectively distribute the control signal to the plurality of tuning arrangements based on the selector signal,
generate a plurality of carrier signals with the plurality of tuning arrangements based on the control signal, and
generate the feedback signal from the plurality of carrier signals based on the selector signal.

9. The carrier generator of claim 8, wherein the front-end circuit comprises a divider configured to divide the feedback signal by an integer determined from the selector signal.

10. The carrier generator of claim 8, wherein each tuning arrangement of the plurality of tuning arrangements comprises an oscillator configured to output a corresponding carrier signal of the plurality of carrier signals.

11. The carrier generator of claim 10, wherein each tuning arrangement of the plurality of tuning arrangements further comprises an input circuit configured to receive the distributed control signal and output an adjusted control signal to the oscillator.

12. The carrier generator of claim 11, wherein
the control signal is a filtered frequency command signal,
the input circuit comprises a memory having data stored therein, and
the adjusted control signal is the filtered frequency command signal having a frequency adjusted based on the stored data.

13. The carrier generator of claim 11, wherein
the control signal is an oscillator control signal,
the input circuit comprises a bias generator configured to generate a bias value, and
the adjusted control signal is the oscillator control signal combined with the bias value.

14. The carrier generator of claim 8, wherein the carrier signal circuit is configured to generate the feedback signal by time-multiplexing the plurality of carrier signals based on the selector signal.

15. A method of generating a plurality of carrier signals, the method comprising:
generating, using a front-end circuit, a control signal based on a frequency reference signal and a feedback signal;
receiving the control signal at a plurality of tuning arrangements;
generating, with the plurality of tuning arrangements, a plurality of carrier signals; and
generating the feedback signal by time-multiplexing the plurality of carrier signals.

16. The method of claim 15, wherein the generating the control signal comprises dividing the feedback signal by a programmable integer.

17. The method of claim 15, wherein the generating the plurality of carrier signals comprises, for each tuning arrangement of the plurality of tuning arrangements, adjusting an oscillator output to correct one or both of a phase or a frequency of a corresponding carrier signal of the plurality of carrier signals.

18. The method of claim 15, further comprising selectively distributing the control signal among the plurality of tuning arrangements based on a selector signal.

19. The method of claim 15, wherein the time-multiplexing the plurality of carrier signals comprises applying a selector signal to the plurality of carrier signals.

20. The method of claim 19, further comprising, before applying the selector signal to the plurality of carrier signals, delaying the selector signal by an amount corresponding to a tuning arrangement propagation delay.

* * * * *